US012683581B2

(12) United States Patent
Isohata et al.

(10) Patent No.: US 12,683,581 B2
(45) Date of Patent: Jul. 14, 2026

(54) RESONATOR COMPONENT, RESONATOR DEVICE, AND METHOD OF MANUFACTURING RESONATOR COMPONENT

(71) Applicant: SEIKO EPSON CORPORATION, Tokyo (JP)

(72) Inventors: Kensaku Isohata, Minowa (JP); Masaya Kanno, Okaya (JP); Atsushi Matsuo, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 945 days.

(21) Appl. No.: 17/958,630

(22) Filed: Oct. 3, 2022

(65) Prior Publication Data
US 2023/0106055 A1      Apr. 6, 2023

(30) Foreign Application Priority Data

Oct. 4, 2021     (JP) ................................. 2021-163301

(51) Int. Cl.
*H03H 9/19*          (2006.01)
*H03H 3/02*          (2006.01)
(52) U.S. Cl.
CPC ................ *H03H 9/19* (2013.01); *H03H 3/02* (2013.01)
(58) Field of Classification Search
CPC ...... H03H 9/19; H03H 9/0519; H03H 9/0514; H03H 9/0504; H03H 9/05; H03H 9/02086;

(Continued)

(56) References Cited

U.S. PATENT DOCUMENTS

2004/0095044 A1     5/2004   Yagishita
2020/0274518 A1 *   8/2020   Yu ......................... H03H 9/1021
2024/0113687 A1 *   4/2024   Matsuo .................... H03H 9/19

FOREIGN PATENT DOCUMENTS

JP         H01-292907 A      11/1989
JP         11274891 A   * 10/1999
(Continued)

*Primary Examiner* — J. San Martin
(74) *Attorney, Agent, or Firm* — Harness, Dickey & Pierce, P.L.C.

(57) ABSTRACT

A resonator component includes a resonator element which has a rectangular shape having a longitudinal direction set to a first direction and a width direction set to a second direction in a plan view, which is made of a piezoelectric material, and which has a first principal surface, a second principal surface having an obverse-reverse relationship with the first principal surface, and a first side surface and a second side surface which are configured to couple the first principal surface and the second principal surface to each other, and extend in the first direction, a first excitation electrode disposed on the first principal surface, a second excitation electrode disposed on the second principal surface, a first mounting electrode electrically coupled to the first excitation electrode, a second mounting electrode electrically coupled to the second excitation electrode, a first side-surface electrode which extends in the first direction on the first side surface, and is electrically coupled to the first mounting electrode, and a second side-surface electrode which extends in the first direction on the second side surface, and is electrically coupled to the second mounting electrode.

7 Claims, 9 Drawing Sheets

(58) Field of Classification Search
CPC ... H03H 9/02031; H03H 9/02023; H03H 9/02
See application file for complete search history.

(56)                    References Cited

FOREIGN PATENT DOCUMENTS

| JP | 2000-091866 A | 3/2000 | |
| JP | 2003-198300 A | 7/2003 | |
| JP | 2004-180274 A | 6/2004 | |
| JP | 3934322 B2 * | 6/2007 | |
| JP | 2017-099032 A | 6/2017 | |
| JP | 6555500 B2 * | 8/2019 | ............. H03H 9/19 |
| JP | 2020-155808 A | 9/2020 | |
| WO | 2018-070135 A1 | 4/2018 | |

* cited by examiner

*FIG. 3*

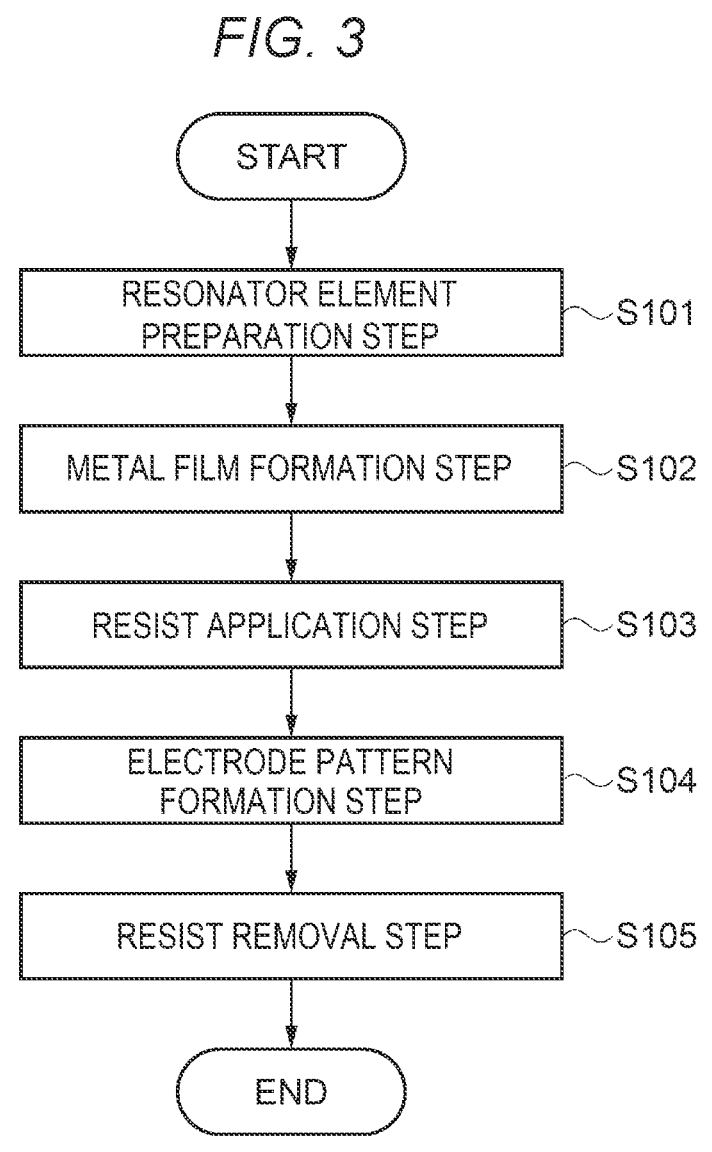

START

RESONATOR ELEMENT PREPARATION STEP ⟶ S101

METAL FILM FORMATION STEP ⟶ S102

RESIST APPLICATION STEP ⟶ S103

ELECTRODE PATTERN FORMATION STEP ⟶ S104

RESIST REMOVAL STEP ⟶ S105

END

RESONATOR COMPONENT, RESONATOR DEVICE, AND METHOD OF MANUFACTURING RESONATOR COMPONENT

The present application is based on, and claims priority from JP Application Serial Number 2021-163301, filed Oct. 4, 2021, the disclosure of which is hereby incorporated by reference herein in its entirety.

BACKGROUND

1. Technical Field

The present disclosure relates to a resonator component, a resonator device, and a method of manufacturing a resonator component.

2. Related Art

There has been known a piezoelectric device which vibrates a piezoelectric element with excitation electrodes disposed on both sides of the piezoelectric element to obtain a desired frequency. In, for example, JP-A-2020-155808 (Document 1), there is disclosed an adjustment of a frequency-dip occurrence temperature achieved by disposing an electrically-conductive film in an area with a distance G from an edge of the excitation electrode and adjusting the distance G.

However, in the piezoelectric device described in Document 1, since the electrically-conductive film is in an electrically-floating state, a charge distribution occurs due to a contour vibration, and further, an unwanted vibration is induced, which has a possibility of deteriorating the vibration characteristic.

SUMMARY

A resonator component includes a resonator element which has a rectangular shape having a longitudinal direction set to a first direction and a width direction set to a second direction crossing the first direction in a plan view, which is made of a piezoelectric material, and which has a first principal surface, a second principal surface having an obverse-reverse relationship with the first principal surface, and a first side surface and a second side surface which are configured to couple the first principal surface and the second principal surface to each other, and extend in the first direction, a first excitation electrode disposed on the first principal surface, a second excitation electrode disposed on the second principal surface, a first mounting electrode electrically coupled to the first excitation electrode, a second mounting electrode electrically coupled to the second excitation electrode, a first side-surface electrode which extends in the first direction on the first side surface, and is electrically coupled to the first mounting electrode, and a second side-surface electrode which extends in the first direction on the second side surface, and is electrically coupled to the second mounting electrode.

A resonator device includes the resonator component described above, and a container configured to house the resonator component, wherein the first mounting electrode and the second mounting electrode are bonded to a mounting surface of the container.

A method of manufacturing a resonator component includes preparing a resonator element which is made of a piezoelectric material, and which has a first principal surface, a second principal surface having an obverse-reverse relationship with the first principal surface, and a first side surface and a second side surface configured to couple the first principal surface and the second principal surface to each other, forming a metal film on an entire surface of the resonator element, applying a resist on the entire surface of the resonator element, and exposing the resist from a direction which is parallel to the first side surface and the second side surface, and which forms an obtuse angle with the first principal surface to form patterns of a first excitation electrode disposed on the first principal surface, a second excitation electrode disposed on the second principal surface, a first mounting electrode electrically coupled to the first excitation electrode, a second mounting electrode electrically coupled to the second excitation electrode, a first side-surface electrode which is disposed on the first side surface, and is electrically coupled to the first mounting electrode, and a second side-surface electrode which is disposed on the second side surface, and is electrically coupled to the second mounting electrode.

A method of manufacturing a resonator component includes preparing a resonator element which is made of a piezoelectric material, and which has a first principal surface, a second principal surface having an obverse-reverse relationship with the first principal surface, a first side surface and a second side surface which are configured to couple the first principal surface and the second principal surface to each other, and which are perpendicular to the first principal surface, and a third side surface and a fourth side surface which are configured to couple the first side surface and the second side surface to each other, and which form obtuse angles with the first principal surface, forming a metal film on an entire surface of the resonator element, applying a resist on the entire surface of the resonator element, and exposing the resist from a direction perpendicular to the first principal surface to form patterns of a first excitation electrode disposed on the first principal surface, a second excitation electrode disposed on the second principal surface, a first mounting electrode electrically coupled to the first excitation electrode, a second mounting electrode electrically coupled to the second excitation electrode, a first side-surface electrode which is disposed on the first side surface, and is electrically coupled to the first mounting electrode, and a second side-surface electrode which is disposed on the second side surface, and is electrically coupled to the second mounting electrode.

BRIEF DESCRIPTION OF THE DRAWINGS

FIG. 3 is a flowchart showing a method of manufacturing the resonator component according to the first embodiment.

FIG. 4 is a diagram showing an exposure method in the method of manufacturing the resonator component according to the first embodiment.

FIG. 5 is a plan view showing a schematic configuration of a resonator component according to a second embodiment.

FIG. 6 is a side view corresponding to FIG. 5.

FIG. 9 is a plan view showing a schematic configuration of a resonator component according to a fourth embodiment.

FIG. 10 is a side view corresponding to FIG. 9.

DESCRIPTION OF EXEMPLARY EMBODIMENTS

1. First Embodiment

1.1. Resonator Element

First, a resonator component 1 according to a first embodiment will be described with reference to FIG. 1 and FIG. 2.

Figure 11:
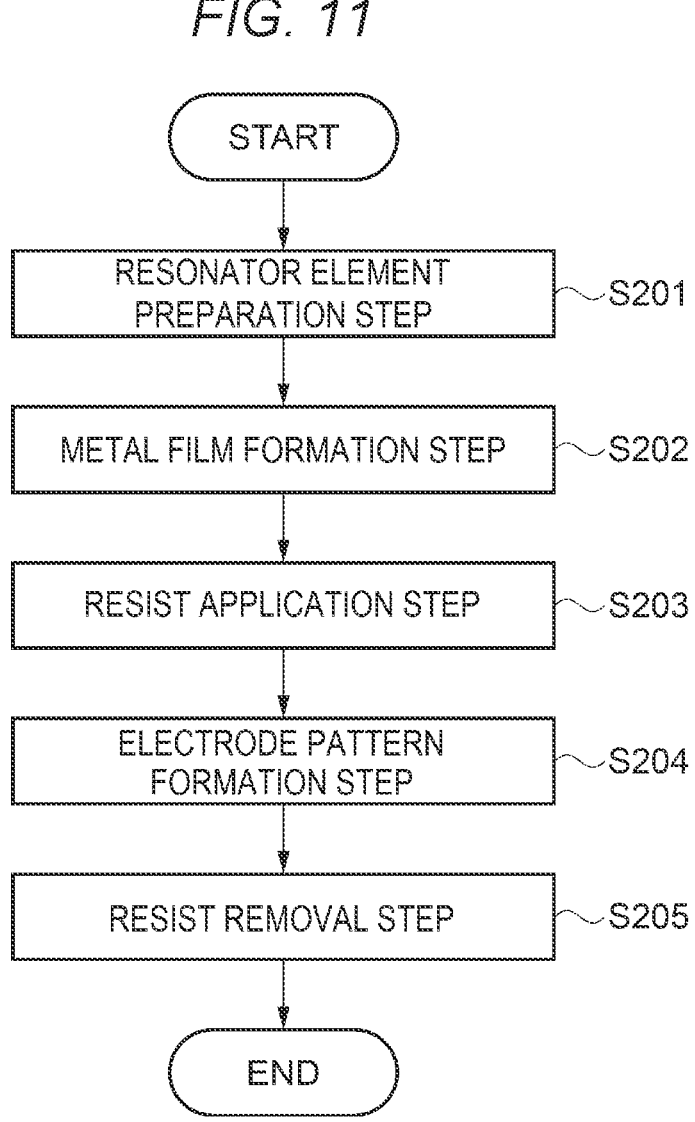
FIG. 11 is a flowchart showing a method of manufacturing the resonator component according to the fourth embodiment.

It should be noted that an X axis, a Y axis, and a Z axis are shown in each of the following drawings except FIG. 3 and FIG. 11 as three axes perpendicular to each other for the sake of convenience of explanation. Further, a direction along the X axis is referred to as an "X direction," a direction along the Y axis is referred to as a "Y direction," and a direction along the Z axis is referred to as a "Z direction." Further, an arrow side of each of the axes is also referred to as a "positive side," and an opposite side to the arrow is also referred to as a "negative side." Further, the positive side in the Z direction is also referred to as an "upper side" or an "obverse side," and the negative side in the Z direction is also referred to as a "lower side" or a "reverse side." Further, in the present embodiment, a first direction corresponds to the Y direction, and a second direction crossing the first direction corresponds to the X direction.

The resonator component 1 according to the present embodiment has a resonator element 10, a first excitation electrode 21, a second excitation electrode 22, first mounting electrodes 23, second mounting electrodes 24, a first side-surface electrode 25, a second side-surface electrode 26, a first lead electrode 27, and a second lead electrode 28.

The resonator element 10 is capable of vibrating in a thickness-shear mode, and is made of a variety of types of piezoelectric materials such as a quartz crystal element. Typically, the resonator element 10 is an AT-cut crystal element, or a double-rotation cut crystal element represented by an SC-cut crystal element. In the present embodiment, the resonator element 10 is assumed as the AT-cut crystal element having a quadrangular shape, specifically a rectangular shape, as a planar shape. Therefore, the X axis, the Y axis, and the Z axis shown in the drawings respectively correspond to a Z' axis, an X axis, and a Y' axis as crystal axes of the quartz crystal.

The resonator element 10 is a rectangular flat plate a longitudinal direction of which is set to the Y direction as the first direction, and a width direction of which is set to the X direction as the second direction. The resonator element 10 has a first principal surface 11, a second principal surface 12 having an obverse-reverse relationship with the first principal surface 11, a first side surface 13 and a second side surface 14 coupling the first principal surface 11 and the second principal surface 12 to each other, and extending in the Y direction, and a third side surface 15 and a fourth side surface 16 coupling the first side surface 13 and the second side surface 14 to each other, and extending in the X direction.

In the resonator element 10, the first excitation electrode 21 is disposed at an approximate center of the first principal surface 11, and the second excitation electrode 22 is disposed at a position which is an approximate center of the second principal surface 12, and overlaps the first excitation electrode 21.

The first excitation electrode 21 is electrically coupled to the first mounting electrode 23 disposed at the negative side in the X direction via the first lead electrode 27 at the negative side in the Y direction, and the second excitation electrode 22 is electrically coupled to the second mounting electrode 24 disposed at the positive side in the X direction via the second lead electrode 28 at the negative side in the Y direction.

The first mounting electrodes 23 are disposed respectively on the first principal surface 11 and the second principal surface 12, and are arranged so as to overlap each other. Further, the first mounting electrode 23 disposed on the first principal surface 11 and the first mounting electrode 23 disposed on the second principal surface 12 are electrically coupled to each other via the first side-surface electrode 25 disposed on the first side surface 13.

Similarly to the first mounting electrodes 23, the second mounting electrodes 24 also disposed respectively on the first principal surface 11 and the second principal surface 12, and are arranged so as to overlap each other, and the second mounting electrode 24 disposed on the first principal surface 11 and the second mounting electrode 24 disposed on the second principal surface 12 are electrically coupled to each other via the second side-surface electrode 26 disposed on the second side surface 14.

In the resonator element 10, there are disposed the first side-surface electrode 25 which extends in the Y direction on the first side surface 13, and is electrically coupled to the first mounting electrode 23, and the second side-surface electrode 26 which extends in the Y direction on the second side surface 14, and is electrically coupled to the second mounting electrode 24. Therefore, it is possible to reduce the phenomenon that the charge distribution occurs due to the contour vibration to further induce the unwanted vibration, and thus prevent the deterioration of the vibration characteristic.

Further, the first excitation electrode 21 and the second excitation electrode 22 are disposed in a first range R1 in the Y direction, and the first side-surface electrode 25 and the second side-surface electrode 26 are disposed in a second range R2 including the first range R1 in the Y direction. In other words, the first side-surface electrode 25 and the second side-surface electrode 26 are longer in length in the Y direction than the first excitation electrode 21 and the second excitation electrode 22. Therefore, since the side-surface electrodes 25, 26 are disposed so as to cover the side surfaces 13, 14 in areas where the excitation electrodes 21, 22 are respectively disposed, it is possible to further suppress the unwanted vibration.

The first side-surface electrode 25 is directly coupled to the first mounting electrodes 23 in an end portion at the negative side in the Y direction, and is not formed in an end portion 17 of the first side surface 13 at the positive side in the Y direction.

The second side-surface electrode 26 is directly coupled to the second mounting electrodes 24 in an end portion at the negative side in the Y direction, and is not formed in an end portion 18 of the second side surface 14 at the positive side in the Y direction.

Therefore, since the side-surface electrodes 25, 26 are directly coupled to the mounting electrodes 23, 24, respectively, it is possible to suppress a migration of the charge generated by the unwanted vibration from the side-surface electrodes 25, 26 to the excitation electrodes 21, 22 to reduce an influence on the vibration characteristic.

As described hereinabove, since the side-surface electrodes 25, 26 electrically coupled to the mounting electrodes 23, 24 are disposed on the side surfaces 13, 14 of the resonator element 10, it is possible for the resonator component 1 according to the present embodiment to reduce the phenomenon that the charge distribution occurs due to the contour vibration to further induce the unwanted vibration, and thus, prevent the deterioration of the vibration characteristic.

1.2. Method of Manufacturing Resonator Component

Then, a method of manufacturing the resonator component 1 according to the present embodiment will be described with reference to FIG. 3 and FIG. 4.

As shown in FIG. 3, the method of manufacturing the resonator component 1 according to the present embodiment includes a resonator element preparation step, a metal film formation step, a resist application step, an electrode pattern formation step, and a resist removal step.

1.2.1. Resonator Element Preparation Step

First, in the step S101, there is prepared the resonator element 10 which is made of a piezoelectric material, and has the first principal surface 11, the second principal surface 12 having an obverse-reverse relationship with the first principal surface 11, the first side surface 13 and the second side surface 14 in the longitudinal direction coupling the first principal surface 11 and the second principal surface 12 to each other, and the third side surface 15 and the fourth side surface 16 in the width direction coupling the first principal surface 11 and the second principal surface 12 to each other. Further, it is desirable to prepare the resonator element 10 using a processing method capable of processing the end surface to flatten such as dry-etching, dicing, or sandblasting so that the side-surface electrodes are easily sputtered.

1.2.2. Metal Film Formation Step

In the step S102, a metal film made of gold or the like is formed on the entire surface of the resonator element 10 using a sputtering device, an evaporation device, or the like.

1.2.3. Resist Application Step

In the step S103, a resist 30 is applied on the entire surface of the resonator element 10 on which the metal film is formed using a resist application device of a spray type or a spin type.

1.2.4. Electrode Pattern Formation Step

Figure 4:
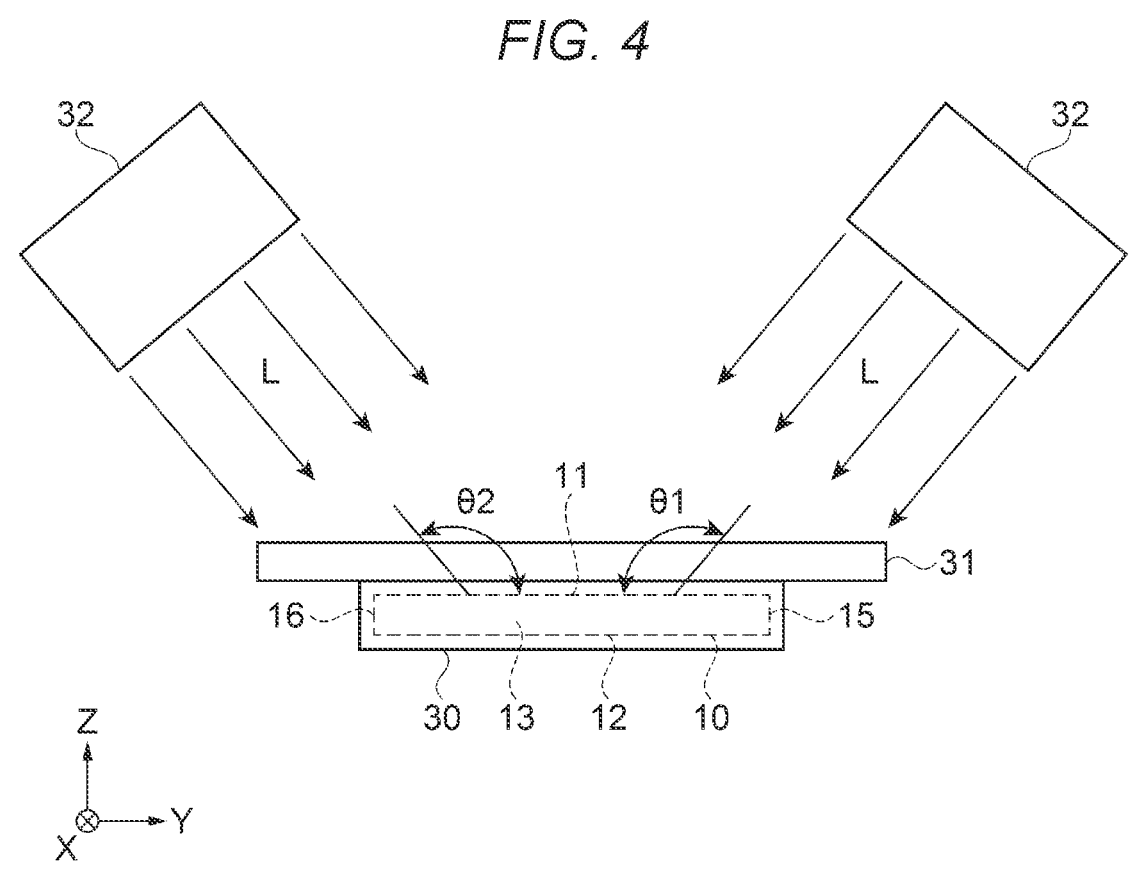

In the step S104, as shown in FIG. 4, a photo mask 31 is arranged on the resonator element 10 on which the resist 30 is applied, then the resist 30 is irradiated with light L of the light source 32 from two directions which are parallel to the first side surface 13 and the second side surface 14, and which form obtuse angles θ1, θ2 with the first principal surface 11 to expose the resist 30. Subsequently, by developing the resist 30 and then etching the metal film exposed from the resist 30, there are formed the electrode patterns of the first excitation electrode 21 disposed on the first principal surface 11, the second excitation electrode 22 disposed on the second principal surface 12, the first mounting electrode 23 electrically coupled to the first excitation electrode 21, the second mounting electrode 24 electrically coupled to the second excitation electrode 22, the first side-surface electrode 25 which is disposed on the first side surface 13, and is electrically coupled to the first mounting electrode 23, and the second side-surface electrode 26 which is disposed on the second side surface 14, and is electrically coupled to the second mounting electrode 24.

It should be noted that by performing the exposure at the obtuse angles θ1, θ2 with the first principal surface 11 from the two directions parallel to the first side surface 13 and the second side surface 14, namely the two directions crossing the third side surface 15 and the fourth side surface 16, it is possible to remove the metal film on the third side surface 15 and the fourth side surface 16, and thus, it is possible to prevent the conduction between the first side-surface electrode 25 and the second side-surface electrode 26.

1.2.5. Resist Removal Step

In the step S105, the resist 30 remaining on the electrodes is removed using a resist stripping liquid, a plasma stripping device, or the like.

Figure 1:
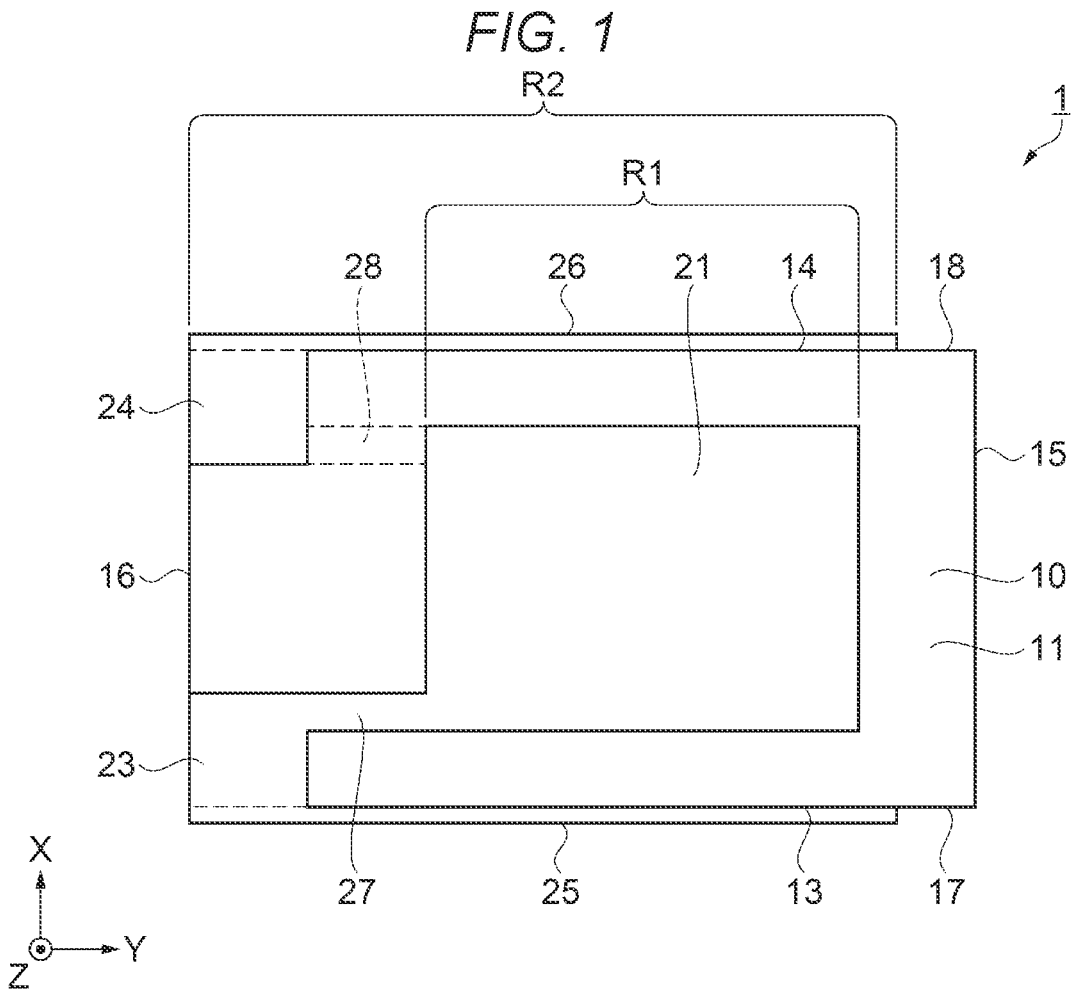
FIG. 1 is a plan view showing a schematic configuration of a resonator component according to a first embodiment.
Figure 2:
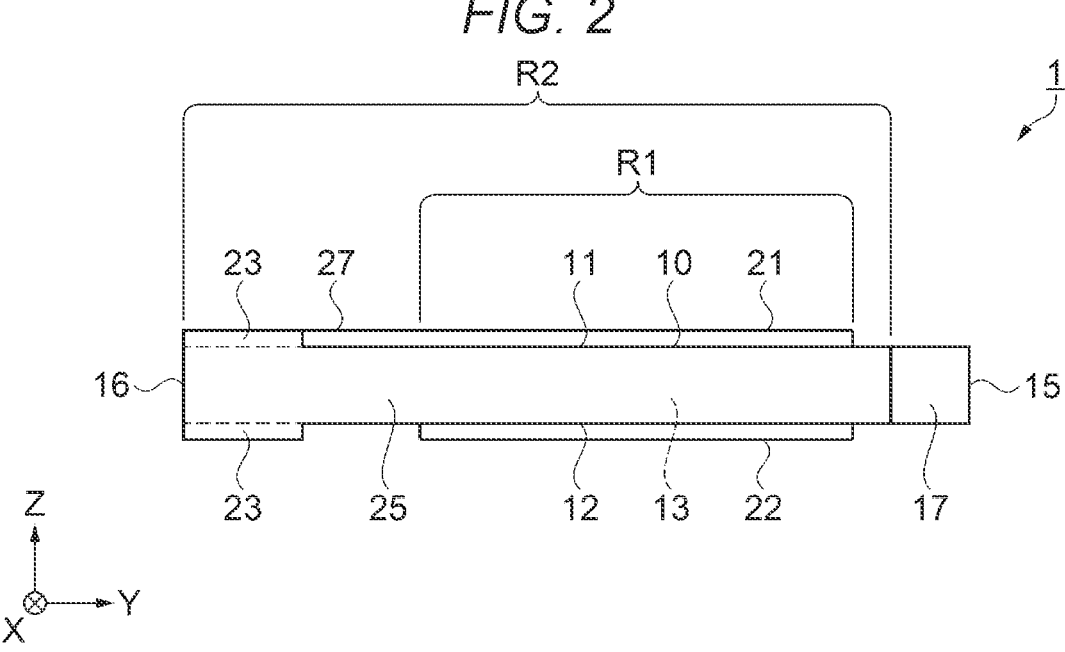
FIG. 2 is a side view corresponding to FIG. 1.

By going through the above steps, the resonator component 1 shown in FIG. 1 and FIG. 2 is completed.

As described hereinabove, since it is possible to dispose the side-surface electrodes 25, 26 electrically coupled to the mounting electrodes 23, 24 on the side surfaces 13, 14 of the resonator element 10, it is possible for the method of manufacturing the resonator component 1 according to the present embodiment to obtain the resonator component 1 which reduces the phenomenon that the charge distribution occurs due to the contour vibration to further induce the unwanted vibration, and thus, prevents the deterioration of the vibration characteristic.

2. Second Embodiment

Then, a resonator component 1a according to a second embodiment will be described with reference to FIG. 5 and FIG. 6.

The resonator component 1a according to the present embodiment is substantially the same as the resonator component 1 according to the first embodiment except the point that shapes of a first side-surface electrode 25a and a second side-surface electrode 26a are different from those in the resonator component 1 according to the first embodiment. It should be noted that the description will be presented with a focus on the difference from the first embodiment described above, and the description of substantially the same issues will be omitted.

Figures 5, 6:
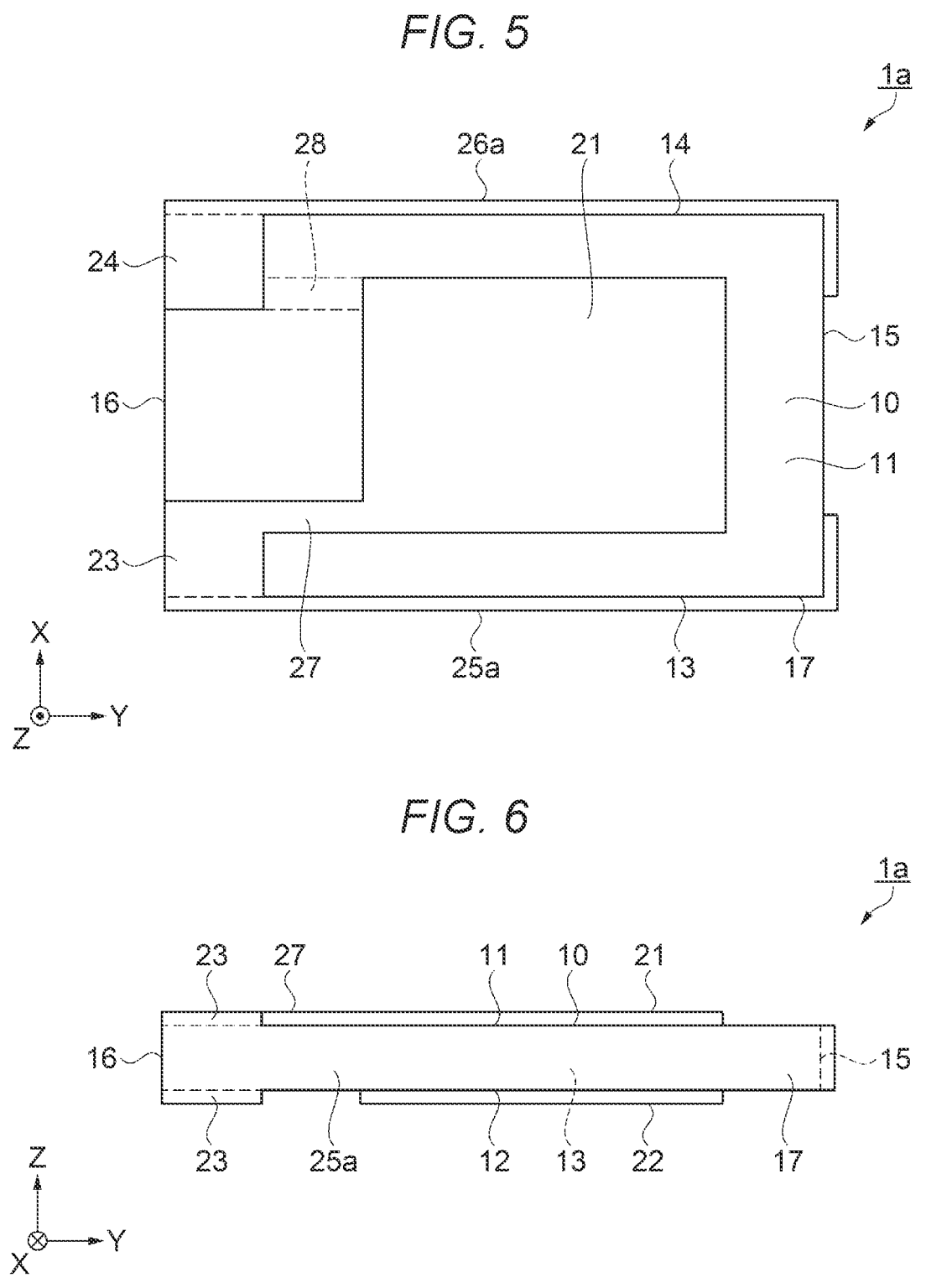

As shown in FIG. 5 and FIG. 6, in the resonator component 1a, the first side-surface electrode 25a is continuously disposed from the first side surface 13 to the third side surface 15, and the second side-surface electrode 26a is continuously disposed from the second side surface 14 to the third side surface 15.

By adopting such a configuration, it is possible to obtain substantially the same advantages as in the first embodiment.

3. Third Embodiment

Then, a resonator component 1*b* according to a third embodiment will be described with reference to FIG. 7 and FIG. 8.

The resonator component 1*b* according to the present embodiment is substantially the same as the resonator component 1 according to the first embodiment except the point that shapes of a first side-surface electrode 25*b* and a second side-surface electrode 26*b* are different from those in the resonator component 1 according to the first embodiment. It should be noted that the description will be presented with a focus on the difference from the first embodiment described above, and the description of substantially the same issues will be omitted.

Figures 7, 8:
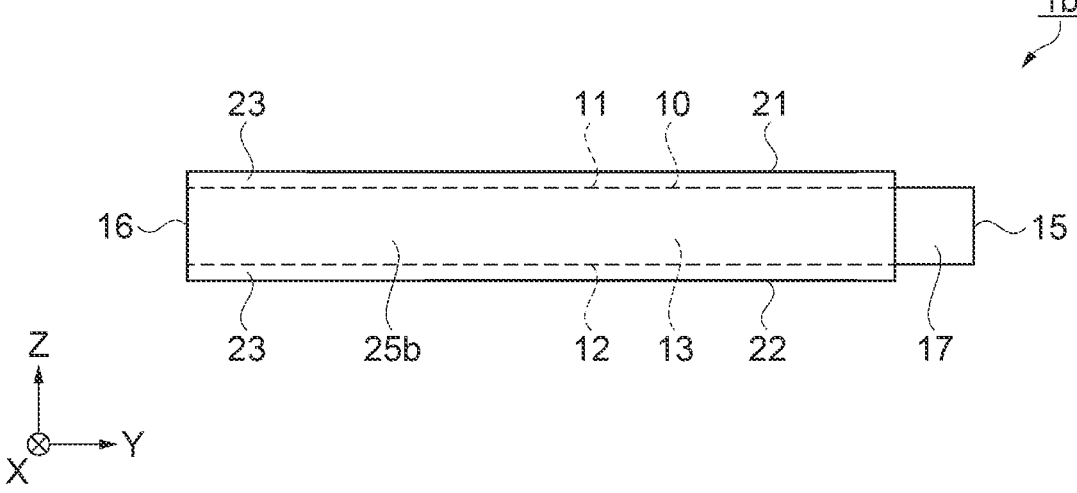
FIG. 7 is a plan view showing a schematic configuration of a resonator component according to a third embodiment.
FIG. 8 is a side view corresponding to FIG. 7.

As shown in FIG. 7 and FIG. 8, in the resonator component 1*b*, the first side-surface electrode 25*b* is continuously disposed from the first side surface 13 to the first principal surface 11 and the second principal surface 12, and the second side-surface electrode 26*b* is continuously disposed from the second side surface 14 to the first principal surface 11 and the second principal surface 12.

By adopting such a configuration, it is possible to obtain substantially the same advantages as in the first embodiment.

4. Fourth Embodiment

4.1. Resonator Component

Then, a resonator component 1*c* according to a fourth embodiment will be described with reference to FIG. 9 and FIG. 10.

The resonator component 1*c* according to the present embodiment is substantially the same as the resonator component 1 according to the first embodiment except the point that a shape of a resonator element 10*c* is different from that of the first resonator component 1 according to the first embodiment. It should be noted that the description will be presented with a focus on the difference from the first embodiment described above, and the description of substantially the same issues will be omitted.

Figures 9, 10:
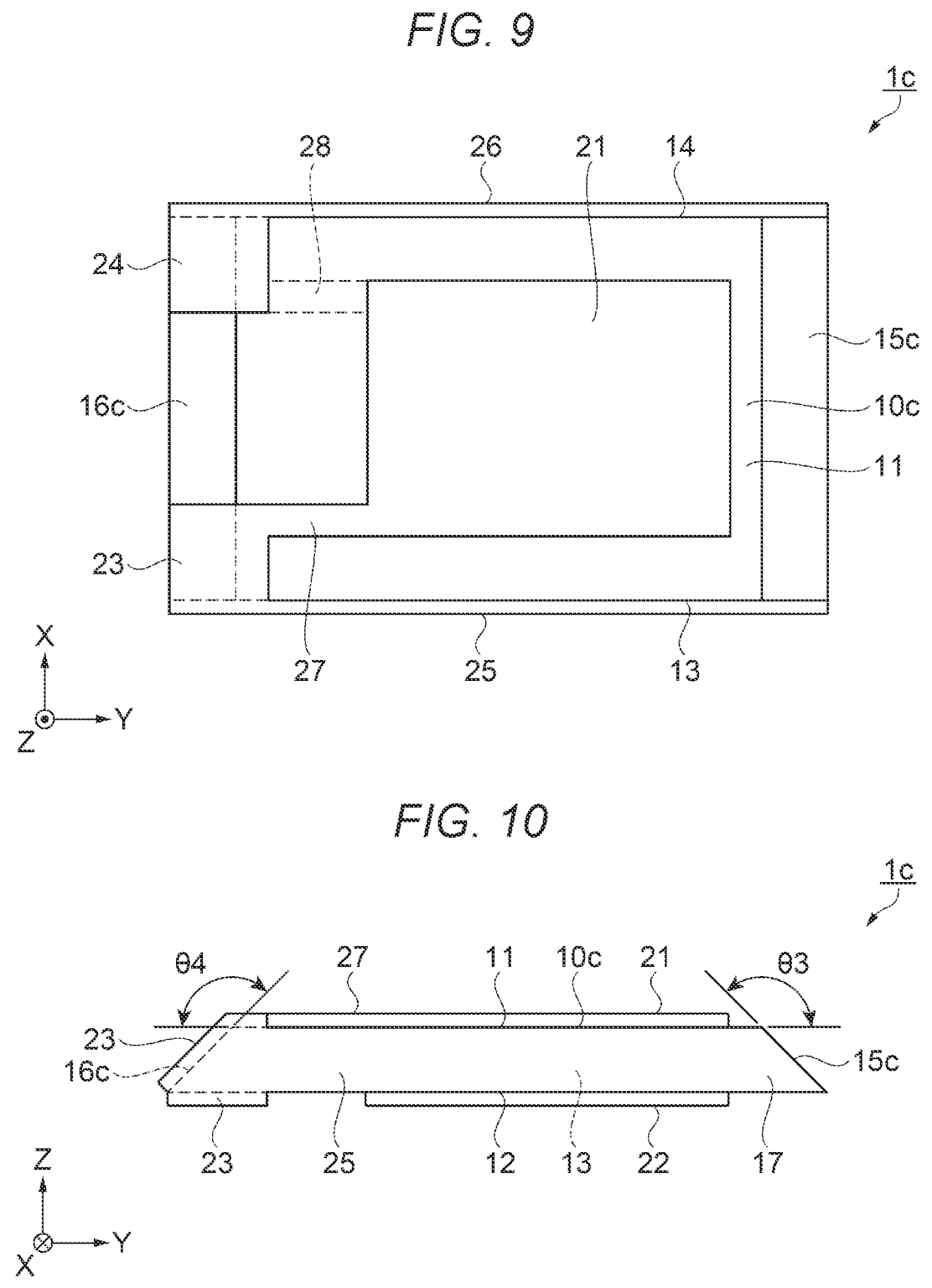

As shown in FIG. 9 and FIG. 10, the resonator component 1*c* has a resonator element 10*c* in which a third side surface 15*c* coupling the first side surface 13 and the second side surface 14 to each other is formed to have an obtuse angle θ3 with the first principal surface 11, and a fourth side surface 16*c* coupling the first side surface 13 and the second side surface 14 to each other is formed to have an obtuse angle θ4 with the first principal surface 11.

By adopting such a configuration, it is possible to obtain substantially the same advantages as in the first embodiment. Further, since it is possible to easily remove the metal films on the third side surface 15*c* and the fourth side surface 16*c* in the manufacturing process, it is possible to prevent the conduction between the first side-surface electrode 25 and the second side-surface electrode 26.

4.2. Method of Manufacturing Resonator Component

Then, a method of manufacturing the resonator component 1*c* according to the present embodiment will be described with reference to FIG. 11 and FIG. 12.

As shown in FIG. 11, the method of manufacturing the resonator component 1*c* according to the present embodiment includes a resonator element preparation step, a metal film formation step, a resist application step, an electrode pattern formation step, and a resist removal step.

4.2.1. Resonator Element Preparation Step

First, in the step S201, there is prepared the resonator element 10*c* which is made of a piezoelectric material, and has the first principal surface 11, the second principal surface 12 having an obverse-reverse relationship with the first principal surface 11, the first side surface 13 and the second side surface 14 coupling the first principal surface 11 and the second principal surface 12 to each other and perpendicular to the first principal surface 11, and the third side surface 15*c* and the fourth side surface 16*c* coupling the first side surface 13 and the second side surface 14 to each other and forming the obtuse angles with the first principal surface 11.

4.2.2. Metal Film Formation Step

In the step S202, a metal film made of gold or the like is formed on the entire surface of the resonator element 10*c* using a sputtering device, an evaporation device, or the like.

4.2.3. Resist Application Step

In the step S203, a resist 30 is applied on the entire surface of the resonator element 10*c* on which the metal film is formed using a resist application device of a spray type or a spin type.

4.2.4. Electrode Pattern Formation Step

Figure 12:
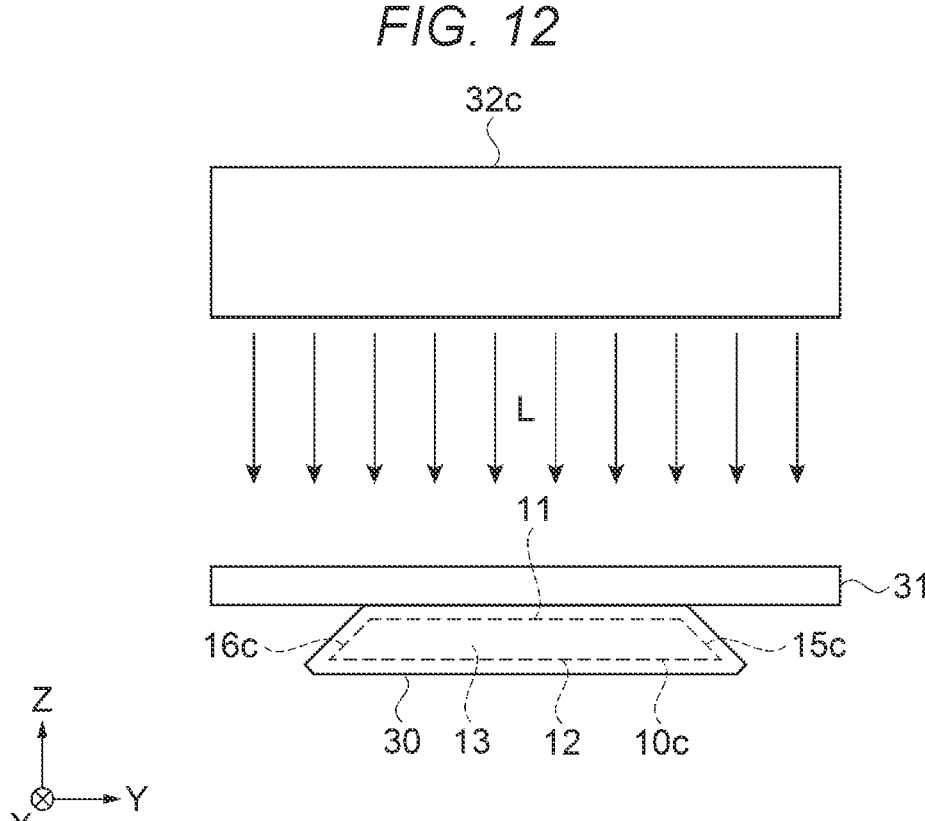
FIG. 12 is a diagram showing an exposure method in the method of manufacturing the resonator component according to the fourth embodiment.

In the step S204, as shown in FIG. 12, the photo mask 31 is arranged on the resonator element 10*c* on which the resist 30 is applied, and the resist 30 is irradiated with the light L of a light source 32*c* from a direction perpendicular to the first principal surface 11 to expose the resist 30. Subsequently, by developing the resist 30 and then etching the metal film exposed from the resist 30, there are formed the electrode patterns of the first excitation electrode 21 disposed on the first principal surface 11, the second excitation electrode 22 disposed on the second principal surface 12, the first mounting electrode 23 electrically coupled to the first excitation electrode 21, the second mounting electrode 24 electrically coupled to the second excitation electrode 22, the first side-surface electrode 25 which is disposed on the first side surface 13, and is electrically coupled to the first mounting electrode 23, and the second side-surface electrode 26 which is disposed on the second side surface 14, and is electrically coupled to the second mounting electrode 24.

It should be noted that since the third side surface 15*c* and the fourth side surface 16*c* are tilted, the metal films on the third side surface 15*c* and the fourth side surface 16*c* can easily be removed by the exposure from the direction perpendicular to the first principal surface 11, and thus, it is possible to prevent the conduction between the first side-surface electrode 25 and the second side-surface electrode 26.

4.2.5. Resist Removal Step

In the step S205, the resist 30 remaining on the electrodes is removed using a resist stripping liquid, a plasma stripping device, or the like.

By going through the above steps, the resonator component 1c shown in FIG. 9 and FIG. 10 is completed.

As described hereinabove, since it is possible to dispose the side-surface electrodes 25, 26 electrically coupled to the mounting electrodes 23, 24 on the side surfaces 13, 14 of the resonator element 10c, it is possible for the method of manufacturing the resonator component 1c according to the present embodiment to obtain the resonator component 1c which reduces the phenomenon that the charge distribution occurs due to the contour vibration to further induce the unwanted vibration, and thus, prevents the deterioration of the vibration characteristic.

5. Fifth Embodiment

Then, a resonator device 100 according to a fifth embodiment equipped with the resonator component 1, 1a, 1b, or 1c will be described with reference to FIG. 13 and FIG. 14. It should be noted that in the following description, the description will be presented illustrating a resonator having a configuration of implementing the resonator component 1. Further, in FIG. 13, a lid 47 is omitted for the sake of convenience of explanation.

Figure 13:
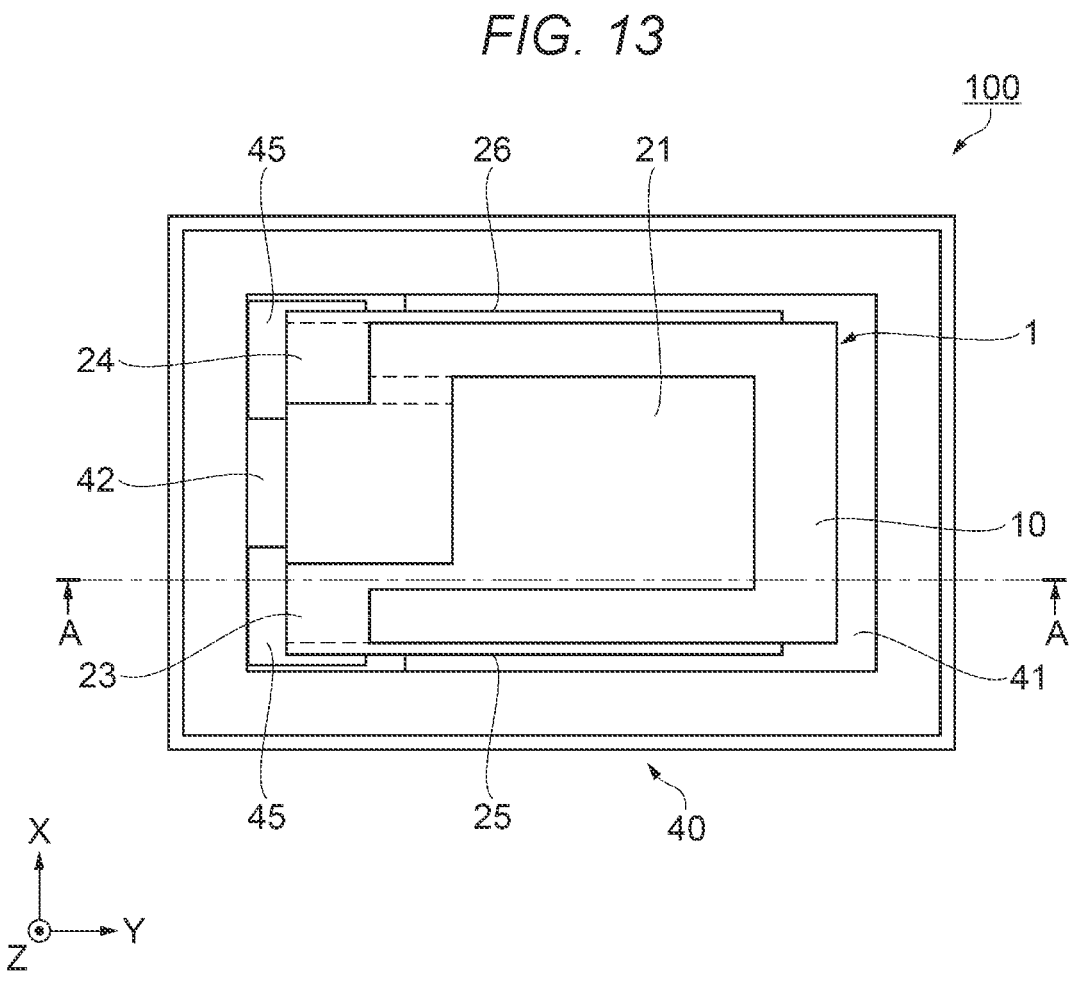
FIG. 13 is a plan view showing a schematic configuration of a resonator device according to a fifth embodiment.
Figure 14:
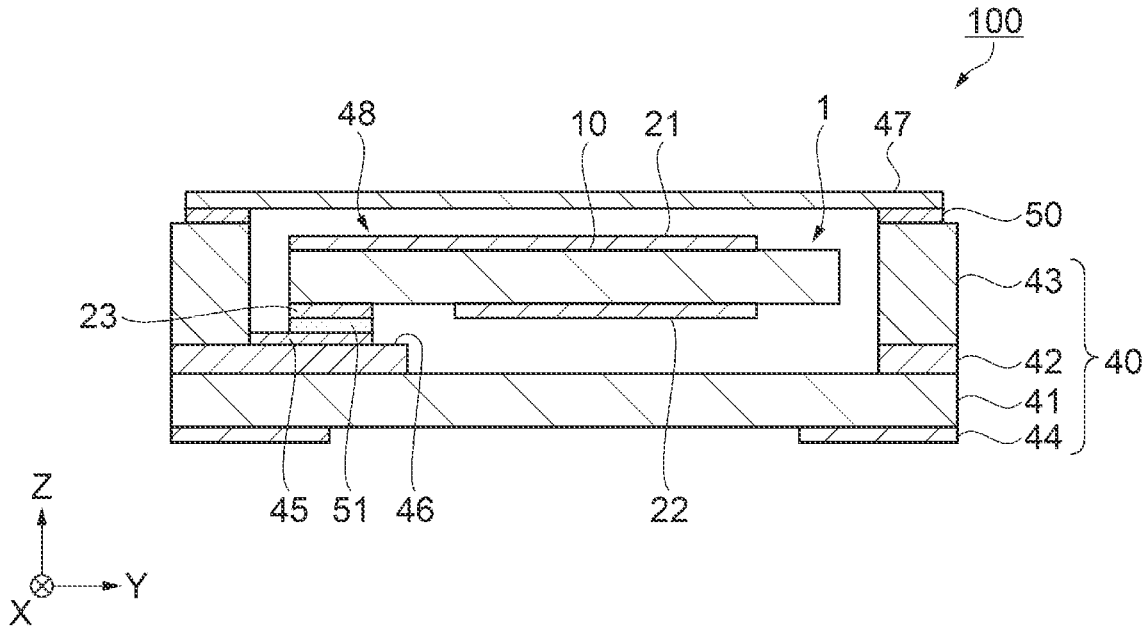
FIG. 14 is a cross-sectional view along a line A-A shown in FIG. 13.

As shown in FIG. 13 and FIG. 14, the resonator device 100 is provided with the resonator component 1, a container 40 which is made of ceramic or the like, and houses the resonator component 1, and the lid 47 made of glass, ceramic, metal, or the like.

As shown in FIG. 14, the container 40 is formed by stacking mounting terminals 44, a first substrate 41, a second substrate 42, a third substrate 43, and a bonding member 50 on one another. Further, the container 40 has a cavity 48 opening upward. It should be noted that by bonding the lid 47 with the bonding member 50 such as a seal ring, an inside of the cavity 48 for housing the resonator component 1 is airtightly sealed to create a reduced pressure atmosphere or an inert gas atmosphere with nitrogen or the like.

The plurality of mounting terminals 44 is disposed on an exterior bottom surface of the first substrate 41. Further, the mounting terminals 44 are electrically coupled respectively to the coupling terminals 45 disposed above the second substrate 42 via through electrodes and inter-layer interconnections not shown.

Inside the cavity 48 of the container 40, there is housed the resonator component 1. The mounting electrodes 23, 24 of the resonator component 1 are bonded and electrically coupled to the coupling terminals 45 disposed on a mounting surface 46 of the second substrate 42 via bonding members 51 such as an electrically-conductive adhesive, respectively. Therefore, the excitation electrodes 21, 22 of the resonator component 1 and the mounting terminals 44 provided to the container 40 are electrically coupled to each other via the mounting electrodes 23, 24, the coupling terminals 45, and so on, respectively.

Since the resonator device 100 according to the present embodiment has the resonator component 1 in which the side-surface electrodes 25, 26 longer in length in the Y direction than the excitation electrodes 21, 22 are disposed on the side surfaces 13, 14 of the resonator element 10, it is possible to reduce the phenomenon that the charge distribution occurs due to the contour vibration to further induce the unwanted vibration, and thus, prevent the deterioration of the vibration characteristic to thereby obtain the vibration characteristic excellent in stability.

It should be noted that in the present embodiment, the description is presented citing the resonator as an example of the resonator device 100, this is not a limitation, and the resonator device 100 can also be an oscillator having the resonator component 1 and an oscillation circuit housed in the container 40. Further, in the resonator component 1, it is possible for the side-surface electrodes 25, 26 to cover the end portions 17, 18, and not to be disposed on the third side surface 15.

What is claimed is:

1. A resonator component comprising:
   a resonator element which has a rectangular shape having a longitudinal direction set to a first direction and a width direction set to a second direction perpendicular to the first direction in a plan view, which is made of a piezoelectric material, and which has a first principal surface, a second principal surface, a first side surface, and a second side surface, the first and second principal surfaces being outwardly opposite to each other along a third direction perpendicular to the first and second directions, the first and second side surfaces being outwardly opposite to each other along the second direction, each of the first and second side surfaces coupling the first principal surface and the second principal surface to each other and extending along the first direction;
   a first excitation electrode disposed on the first principal surface, the first excitation electrode having a first length along the first direction in the plan view;
   a second excitation electrode disposed on the second principal surface;
   a first mounting electrode electrically coupled to the first excitation electrode;
   a second mounting electrode electrically coupled to the second excitation electrode;
   a first side-surface electrode:
      extending in the first direction on the first side surface;
      having a second length along the first direction;
      being disposed on an entirety of a height, along the third direction, of the first side surface within a range of the second length; and
      being electrically coupled to the first mounting electrode; and
   a second side-surface electrode:
      extending in the first direction on the second side surface; and
      being electrically coupled to the second mounting electrode,
   wherein the second length is longer than the first length.

2. The resonator component according to claim 1, wherein the first side-surface electrode is directly coupled to the first mounting electrode, and the second side-surface electrode is directly coupled to the second mounting electrode.

3. The resonator component according to claim 1, wherein the first side-surface electrode and the second side-surface electrode are not disposed at end portions of the first side surface and the second side surface, respectively.

4. The resonator component according to claim 1, wherein the resonator element has a third side surface configured to couple the first side surface and the second side surface to each other, the first side-surface electrode is continuously disposed from the first side surface to the third side surface, and the second side-surface electrode is continuously disposed from the second side surface to the third side surface.

5. The resonator component according to claim 1, wherein the first side-surface electrode is continuously disposed from the first side surface to the first principal surface and the second principal surface, and the second side-surface electrode is continuously disposed from the second side surface to the first principal surface and the second principal surface.

6. A resonator device comprising:

the resonator component according to claim 1; and a container configured to house the resonator component, wherein the first mounting electrode and the second mounting electrode are bonded to a mounting surface of the container.

7. A resonator component comprising:

a resonator element which has a rectangular shape having a longitudinal direction set to a first direction and a width direction set to a second direction crossing the first direction in a plan view, which is made of a piezoelectric material, and which has a first principal surface, a second principal surface having an obverse-reverse relationship with the first principal surface, and a first side surface and a second side surface which are configured to couple the first principal surface and the second principal surface to each other, and extend in the first direction;

a first excitation electrode disposed on the first principal surface;

a second excitation electrode disposed on the second principal surface;

a first mounting electrode electrically coupled to the first excitation electrode;

a second mounting electrode electrically coupled to the second excitation electrode;

a first side-surface electrode which extends in the first direction on the first side surface, and is electrically coupled to the first mounting electrode; and a second side-surface electrode which extends in the first direction on the second side surface, and is electrically coupled to the second mounting electrode, wherein the resonator element has a third side surface configured to couple the first side surface and the second side surface to each other, the first side-surface electrode is continuously disposed from the first side surface to the third side surface, and the second side-surface electrode is continuously disposed from the second side surface to the third side surface.

* * * * *